United States Patent
Kim et al.

(10) Patent No.: US 8,343,844 B2
(45) Date of Patent: Jan. 1, 2013

(54) METHOD FOR MANUFACTURING CAPACITOR OF SEMICONDUCTOR DEVICE AND CAPACITOR OF SEMICONDUCTOR DEVICE MANUFACTURED THEREBY

(75) Inventors: Wandon Kim, Yongin-si (KR); Jong Cheol Lee, Seoul (KR); Jin Yong Kim, Seoul (KR); Beom Seok Kim, Suwon-si (KR); Yong-Suk Tak, Seoul (KR); Kyuho Cho, Hwaseong-si (KR); Ohseong Kwon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 34 days.

(21) Appl. No.: 13/071,927

(22) Filed: Mar. 25, 2011

(65) Prior Publication Data

US 2011/0237043 A1 Sep. 29, 2011

(30) Foreign Application Priority Data

Mar. 29, 2010 (KR) ........................ 10-2010-0028012

(51) Int. Cl.
*H01L 21/20* (2006.01)

(52) U.S. Cl. ........ 438/381; 438/243; 438/244; 438/296; 438/386; 438/387; 438/391; 257/E21.396; 257/E21.346

(58) Field of Classification Search ........................ None
See application file for complete search history.

(56) References Cited

U.S. PATENT DOCUMENTS

| 6,746,876 B2 | 6/2004 | Itoh et al. | |
|---|---|---|---|
| 2009/0086404 A1* | 4/2009 | Masuda et al. | 361/303 |

FOREIGN PATENT DOCUMENTS

| JP | 2004-014714 | 1/2004 |
|---|---|---|
| KR | 10-2003-0058667 A | 7/2003 |
| KR | 10-2003-00059415 A | 7/2003 |
| KR | 10-2003-0093919 A | 12/2003 |

* cited by examiner

*Primary Examiner* — Julio J Maldonado
*Assistant Examiner* — Yasser Abdelaziez
(74) *Attorney, Agent, or Firm* — Lee & Morse, P.C.

(57) ABSTRACT

A method of manufacturing a capacitor of a semiconductor device includes forming a high-k dielectric pattern on a semiconductor substrate, the high-k dielectric pattern having a pillar shape including a hole therein, forming a lower electrode in the hole of the high-k dielectric pattern, locally forming a blocking insulating pattern on an upper surface of the lower electrode, and forming an upper electrode covering the high-k dielectric pattern and the blocking insulating pattern.

12 Claims, 16 Drawing Sheets

METHOD FOR MANUFACTURING CAPACITOR OF SEMICONDUCTOR DEVICE AND CAPACITOR OF SEMICONDUCTOR DEVICE MANUFACTURED THEREBY

BACKGROUND

1. Field

The present disclosure herein relates to a method of manufacturing a capacitor of a semiconductor device and a capacitor of a semiconductor device manufactured by the same, and more particularly, to a method of manufacturing a semiconductor device which includes a metal-insulator-metal (MIM) capacitor and a semiconductor device manufactured by the same.

2. Description of the Related Art

A dynamic random access memory (DRAM) device, which is a sort of semiconductor memory devices, includes one transistor and one capacitor. Data storage capability of the DRAM is determined by a capacitance of the capacitor. However, as the semiconductor devices are developed to high integration, capacitors are required to have a high capacitance in a limited area.

In a DRAM device, the capacitance of the capacitor is proportional to a surface area of an electrode and a dielectric constant of a dielectric layer while being inversely proportional to an equivalent oxide thickness of the dielectric layer. Accordingly, in order to increase the capacitance of the capacitor within a limited area, a 3D capacitor may be provided so that a surface area of the electrode is increased. Also, the capacitance the capacitor may be increased by reducing the equivalent oxide thickness of the dielectric layer or by using a dielectric layer having a high dielectric constant.

The surface area of the electrode may be increased by increasing height of a lower electrode or a storage electrode, increasing an effective surface area of the lower electrode using a hemi-spherical grain (HSG), or using inner and outer surface areas of a cylinder by using a one cylinder storage (OCS) electrode.

The dielectric layer having a high dielectric constant may include a metal oxide layer such as $TiO_2$ and $Ta_2O_5$, and a ferroelectric with a perovskite structure such as $BaSrTiO_3$.

SUMMARY

According to an embodiment, there is provided a method of manufacturing a capacitor of a semiconductor device, including forming a high-k dielectric pattern on a semiconductor substrate, the high-k dielectric pattern having a pillar shape including a hole therein, forming a lower electrode in the hole of the high-k dielectric pattern, forming a blocking insulating pattern on an upper surface of the lower electrode, and forming an upper electrode covering the high-k dielectric pattern and the blocking insulating pattern.

The blocking insulating pattern may be made of a material having a lower dielectric constant than the high-k dielectric pattern.

The blocking insulating pattern may be formed to be thicker than the high-k dielectric pattern.

The forming of the blocking insulating pattern may includes forming a recess region partially exposing a sidewall of the high-k dielectric pattern by recessing the upper surface of the lower electrode, and forming the blocking insulating pattern in the recess region.

The forming of the high-k dielectric pattern may include forming an insulating layer and a sacrificial layer sequentially on the semiconductor substrate, forming an opening in the sacrificial layer to expose the insulating layer, forming a high-k dielectric layer conformally on a surface of the opening, performing a first heat treatment to the high-k dielectric layer in an oxygen atmosphere at a temperature of about 500° C. to 1000° C., and forming the hole by patterning the heat-treated high-k dielectric layer and the insulating layer.

The forming of the lower electrode may include forming a first lower conductive layer conformally on the heat-treated high-k dielectric layer before the hole is formed, forming a first lower conductive pattern on the high-k dielectric pattern simultaneously with formation of the hole, and forming a second lower conductive pattern that fills the hole.

The upper electrode may directly contact an upper surface of the insulating layer.

The method may further include removing the sacrificial layer before forming the upper electrode, and forming an upper dielectric layer having a same crystalline structure as the high-k dielectric pattern by using the high-k dielectric pattern as a seed.

The sacrificial layer may include any one of a silicon oxide, a polysilicon, and a polymer-based material.

The high-k dielectric pattern may include any one or a combination of $HfO_2$, $ZrO_2$, $AlO_3$, $La_2O_3$, $Ta_2O_3$, $TiO_2$, $SrTiO_3$(STO), $(Ba,Sr)TiO_3$(BST), $BaTiO_2$, PZT, and PLZT.

The blocking insulating pattern may include at least one of a silicon oxide, a silicon nitride, a silicon oxynitride, and a metal oxide.

According to an embodiment, there is provided a capacitor of a semiconductor device, including a lower electrode on a semiconductor substrate; a dielectric layer covering a surface of the lower electrode; and an upper electrode covering the dielectric layer, wherein the dielectric layer comprises a high-k dielectric pattern contacting a sidewall of the lower electrode and a blocking insulating pattern contacting an upper surface of the lower electrode, the blocking insulating pattern having a lower dielectric constant than the high-k dielectric pattern.

The blocking insulating pattern may be thicker than the high-k dielectric pattern.

The high-k dielectric pattern and the blocking insulating pattern may have different chemical compositions from each other.

The high-k dielectric pattern and the blocking insulating pattern may have a same chemical composition but different crystalline structures.

The capacitor may further include an upper dielectric layer disposed between the upper electrode and the dielectric layer to conformally cover the dielectric layer. The upper dielectric layer may have substantially the same crystalline structure as the high-k dielectric pattern.

The capacitor may further include an insulating layer disposed to surround the lower electrode on the semiconductor substrate. The upper electrode may directly contact the dielectric layer, the high-k dielectric pattern, and the blocking insulating pattern.

The high-k dielectric pattern may include any one or a combination of $HfO_2$, $ZrO_2$, $AlO_3$, $La_2O_3$, $Ta_2O_3$, $TiO_2$, $SrTiO_3$(STO), $(Ba,Sr)TiO_3$(BST), $BaTiO_2$, PZT, and PLZT.

The blocking insulating pattern may include at least one selected from a silicon oxide, a silicon nitride, a silicon oxynitride, and a metal oxide.

According to an embodiment, there is provided a method of manufacturing a capacitor of a semiconductor device, the method including forming an etch-stop layer and a sacrificial layer on a substrate, the substrate including a transistor and a contact plug electrically connected to a drain region of the transistor, forming a hole in the sacrificial layer to expose the etch stop layer in a region of the etch-stop layer corresponding to the contact plug, conformally forming a high k dielectric layer on the sacrificial layer, including on sidewalls of the hole, and the exposed etch-stop layer, performing a first heat treatment, forming a first lower conductive layer on the high k dielectric layer after the first heat treatment, performing a plasma treatment and a second heat treatment, etching the high-k dielectric layer and the first lower conductive layer to remove the high k dielectric layer and the first lower conductive layer from an upper surface of the sacrificial layer and from a bottom portion of the hole such that the contact plug is exposed, thereby forming a high k dielectric pattern and first lower conductive layer pattern on the sidewalls of the hole, forming a second lower conductive layer that fills the hole, removing upper portions of the first lower conductive layer pattern and second lower conductive layer to provide a recess region and to expose an upper portion of the high-k dielectric pattern, forming a blocking insulating pattern in the recess region, wherein the removing of the upper portions of the first lower conductive layer and the second conductive layer to provide the recess region is carried out such that the blocking insulating pattern formed in the recess region has a greater thickness than a thickness of the high k dielectric pattern, removing the sacrificial layer to expose an outer surface of the high k dielectric pattern, conformally forming an upper electrode to cover the high k dielectric pattern and the blocking insulating pattern; and performing a third heat treatment.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
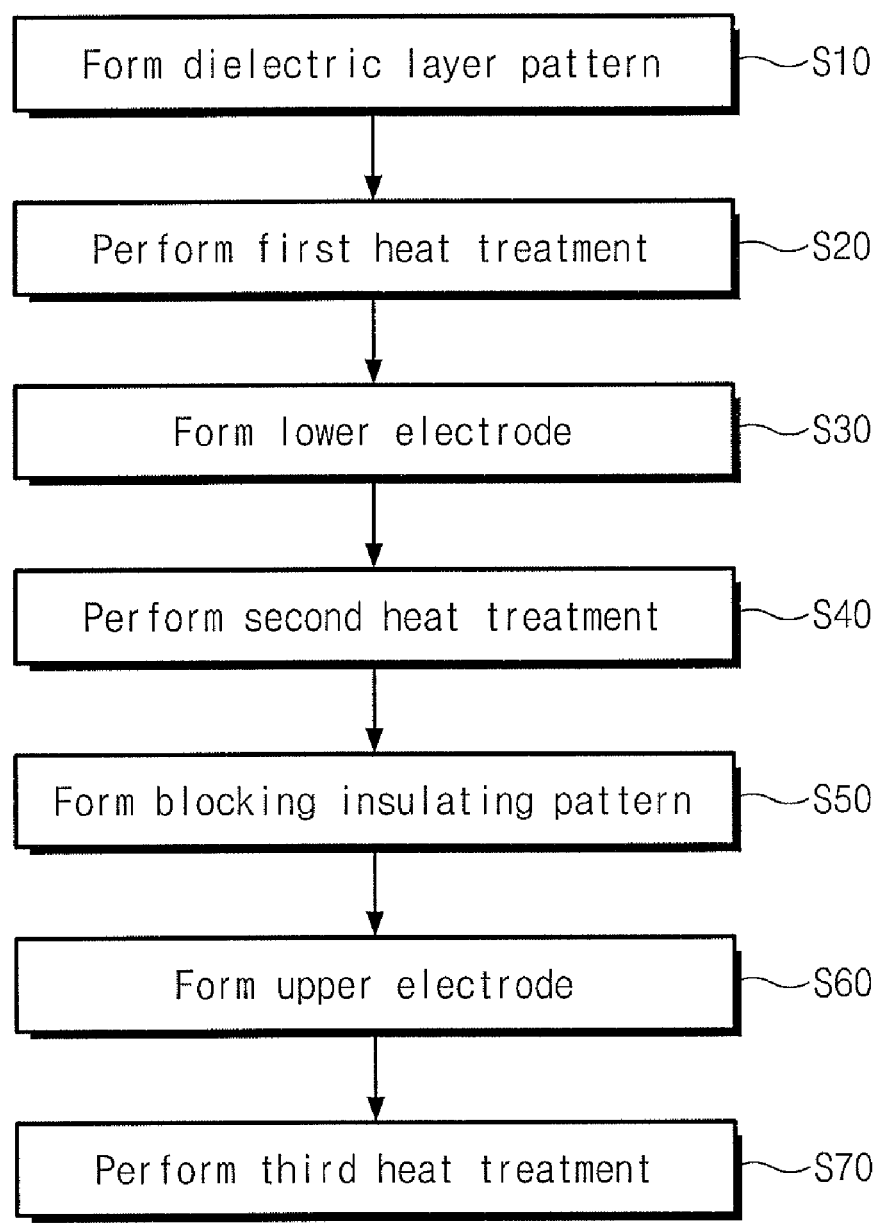
FIG. 1 illustrates a flowchart illustrating a method of manufacturing a capacitor of a semiconductor memory device, according to an embodiment.

Korean Patent Application No. 10-2010-0028012, filed on Mar. 29, 2010, in the Korean Intellectual Property Office, and entitled: "Method for Manufacturing Capacitor of Semiconductor Device and Capacitor of Semiconductor Device Manufactured Thereby," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

In the following description, the technical terms are used only for explaining a specific exemplary embodiment while not limiting the present invention. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the inventive concept.

Hereinafter, a method of manufacturing a capacitor of a semiconductor memory device according to an exemplary embodiment of the inventive concept will be described in detail with reference to FIGS. 1 through 11.

FIG. 1 illustrates a flowchart illustrating a method of manufacturing a capacitor of a semiconductor memory device, according to an embodiment of the inventive concept. FIGS. 2 through 11 illustrate sectional views illustrating the capacitor manufacturing method according to the embodiment.

Figure 2:
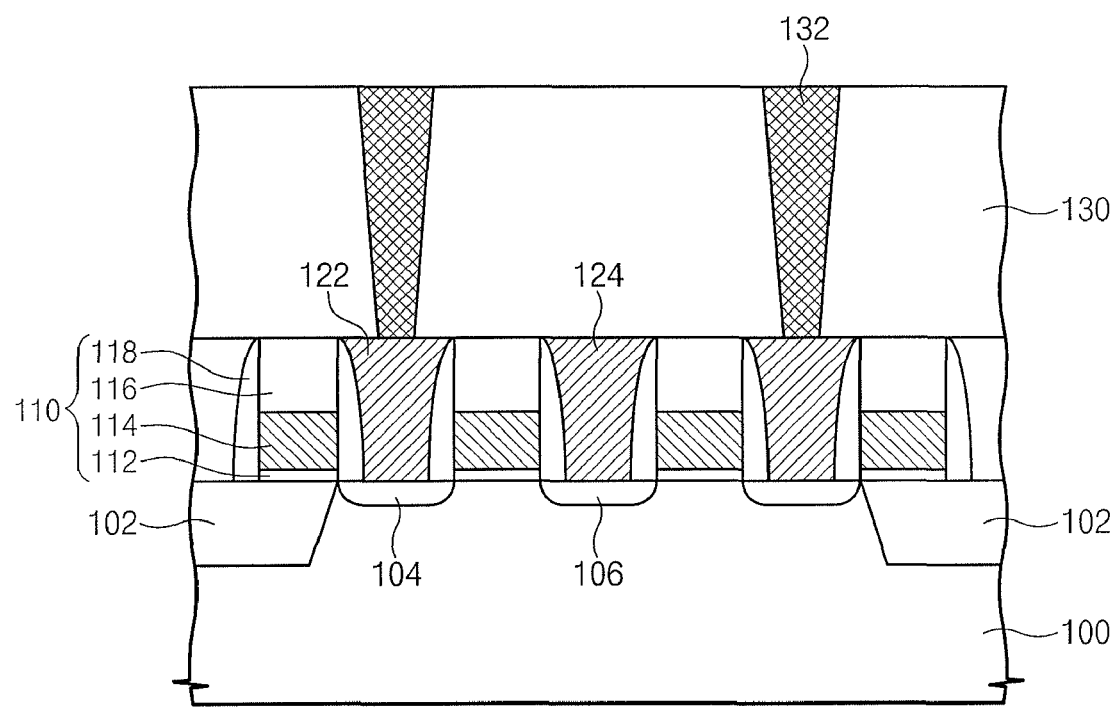
FIGS. 2 through 11 illustrate sectional views illustrating the capacitor manufacturing method according to the embodiment.

Referring to FIG. 2, transistors are formed on a semiconductor substrate 100 on which an active region is defined. The transistor includes a gate electrode 110, source regions 104, and drain regions 106.

More specifically, the active regions are defined by device isolation layers 102 formed in the semiconductor substrate 100. The gate electrodes 110 are formed across the active region on the semiconductor substrate 100. The source/drain regions 104 and 106 doped with impurities are disposed on both sides of the gate electrodes 110 in the active region. Specifically, the gate electrode 110 may be manufactured by sequentially depositing and patterning a gate dielectric layer 112, a gate conductive layer 114, and a capping dielectric layer 116. Spacers 118 may be formed on both sides of the patterned gate dielectric layer 112, gate conductive layer 114, and capping dielectric layer 116. The gate dielectric layer 112 may include a thermal oxide layer, a silicon oxide layer, a silicon oxynitride layer, or a high-k dielectric layer. The gate conductive layer 114 may include at least one of a polysilicon layer, a metal layer, a metal nitride layer, and a metal silicide layer. The capping dielectric layer 116 and the spacer 118 may include a silicon nitride layer.

Next, a first interlayer dielectric (not shown) may be formed on an upper part of the semiconductor substrate 100 on which the gate electrodes 110 and the source/drain regions 104 and 106 are disposed.

The first interlayer electrode may be manufactured using a film formation technology having excellent step coverage property, such as chemical vapor deposition (CVD) or atomic layer deposition (ALD). The first interlayer dielectric may be formed of materials having excellent gap-fill characteristics, including a boron-phosphor silicate glass (BPSG) layer, a High Density Plasma (HDP) oxide layer, a tetra ethyl ortho silicate (TEOS) layer, undoped silicate glass (USG), or Tonen SilaZene (TOSZ) (a polysilazene material). After vapor-deposition of the first interlayer, an upper surface of the first interlayer dielectric may be planarized by chemical mechanical polishing (CMP) or an etch-back process.

Next, contact pads 122 and 124 may be connected with the source/drain regions 104 and 106 are formed on the first interlayer dielectric.

More specifically, photolithography may be performed on the first interlayer dielectric, thereby forming contact holes exposing the source/drain regions 104 and 106 disposed in the semiconductor substrate 100. In a case where the contact holes are formed on the first interlayer dielectric made of a silicon oxide, an etch gas having a high etch selectivity with respect to the gate electrode 110 may be used so that the contact holes are self-aligned with the gate electrode 110 and the source/drain regions 104 and 106 are exposed. A conductive layer filling the contact holes may be vapor-deposited and planarized, thereby forming the contact pads 122 and 124 self-aligned in the first interlayer dielectric. The contact pads 122 and 124 formed in the first interlayer dielectric may be classified into storage node contact pads 122 connected with the drain regions of the transistor and bit-line contact pads 124 connected with the source regions of the transistor.

Next, a second interlayer dielectric 130 may be formed on the first interlayer dielectric. A contact plug 132 which connects the storage node contact pad 122 with a lower electrode of the capacitor may be formed in the second interlayer dielectric 130. A bit line (not shown) may be formed in electrical connection with the bit-line contact pad 124 before the contact plug 132 is formed.

The contact plug 132 may be formed by forming a contact hole that exposes the storage node contact pad 122 through the second interlayer dielectric 130 and then vapor-depositing and planarizing a conductive layer in the contact hole. The contact plug 132 may include at least one of a polysilicon layer, a metal layer, a metal nitride layer, and a metal silicide layer.

Figure 3:
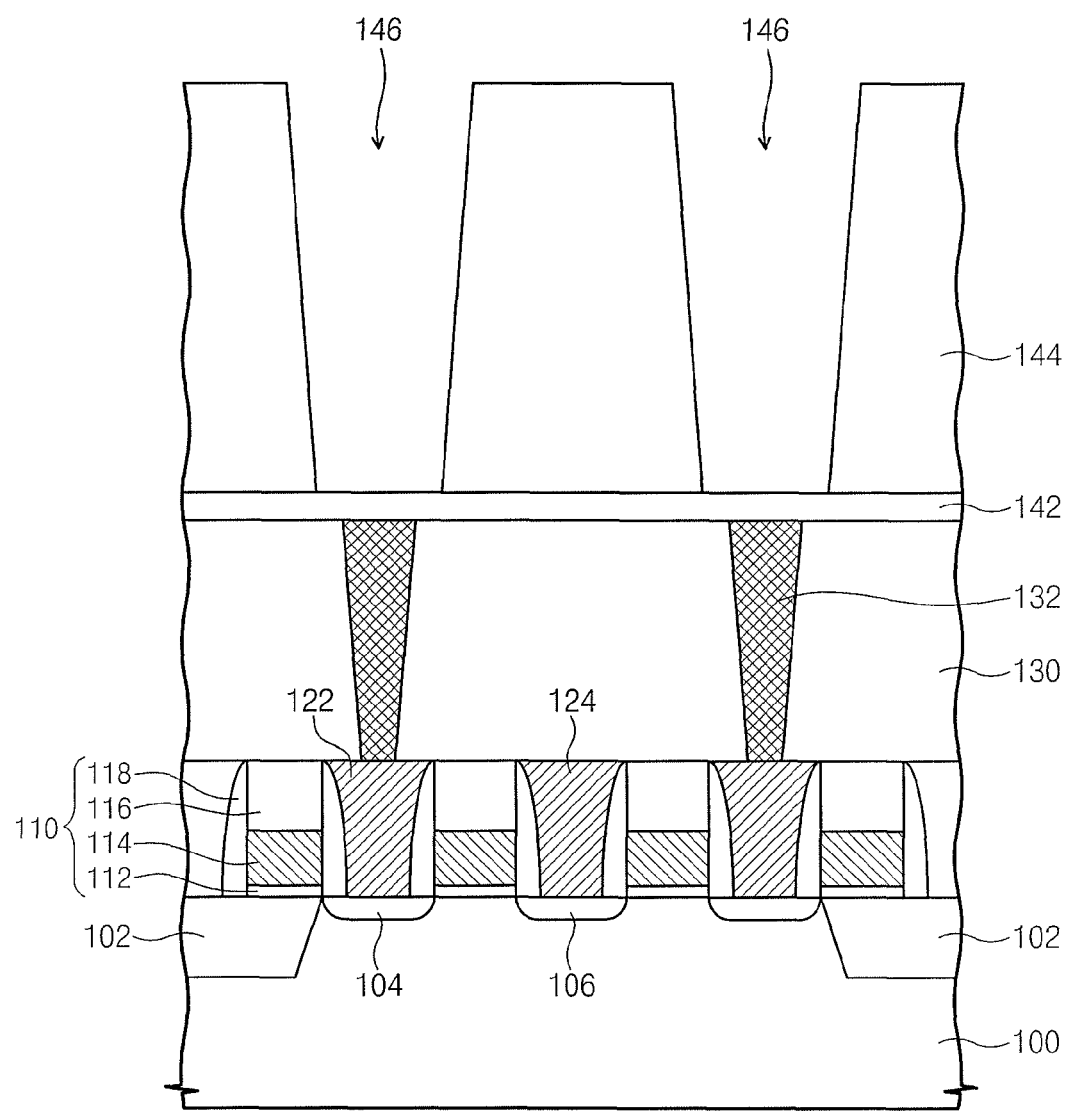

Referring to FIG. 3, an etch stop layer 142 and a sacrificial layer 144 may be formed sequentially on an upper surface of the second interlayer dielectric 130.

The etch stop layer 142 may be used as an etch end point when the sacrificial layer 144 formed thereon is patterned. The etch stop layer 142 may have a thickness of about 100 Å to 500 Å and may be a silicon nitride layer or a silicon oxynitride layer.

The sacrificial layer 144 may be formed by vapor-depositing an insulating material to a thickness of about 3000 Å to 6000 Å.

The thickness of the sacrificial layer 144 may determine a height of the capacitor. The sacrificial layer 144 may be a silicon oxide layer, a polysilicon layer, or a polymer-based layer removed by dry etching in the oxygen atmosphere. Examples of the material of the sacrificial layer include borosilicate glass (BSG), phosphosilicate glass (PSG), borophosphosilicate Glass (BPSG), TEOS, and USG.

Next, the sacrificial layer 144 may be patterned, thereby forming an opening 146 that exposes the etch stop layer 142 at an upper part of the contact plug 132. The opening 146 may be formed by performing an isotropic etching with respect to the sacrificial layer 144. A width of the opening 146 may decrease toward a lower part. In other words, the opening 146 may have an inclined sidewall.

Figure 4:
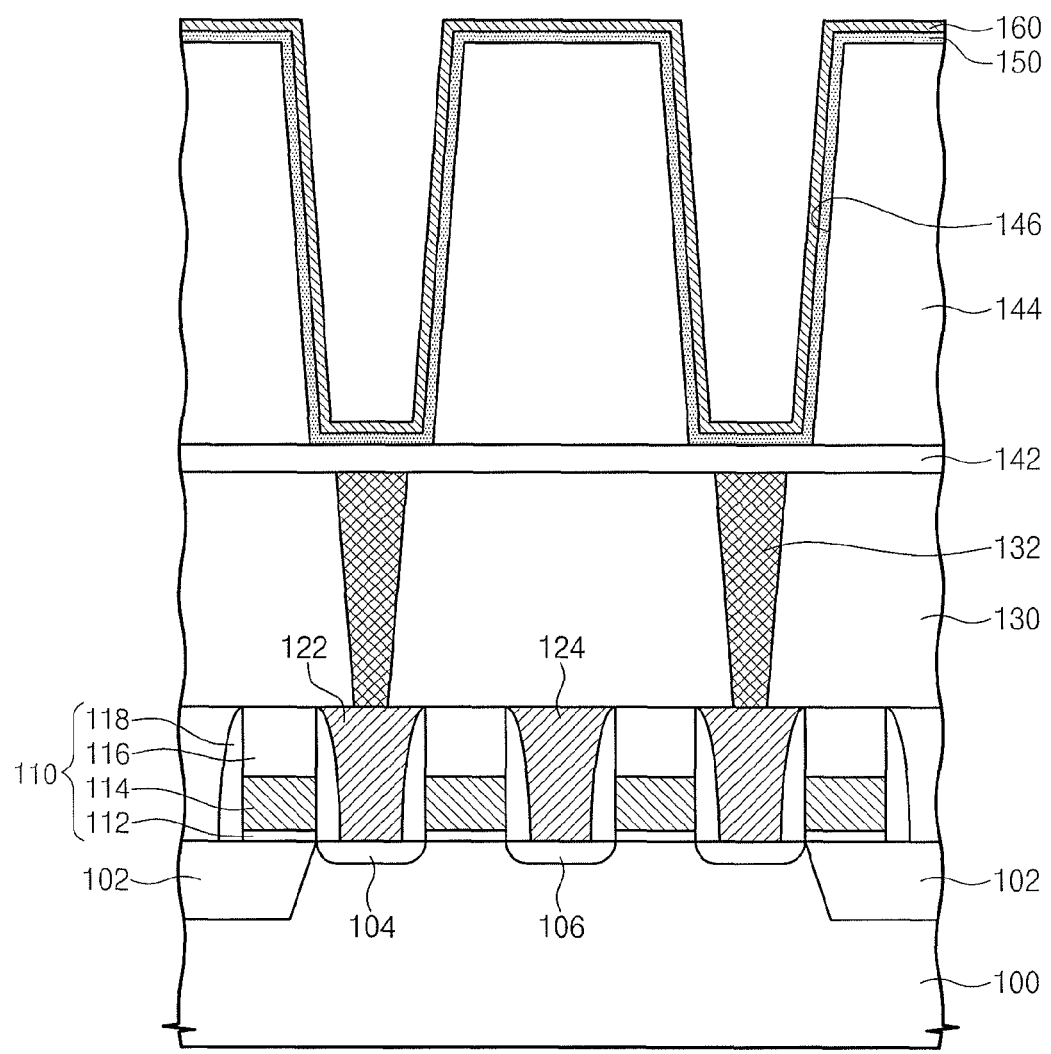

Referring to FIG. 1, after the sacrificial layer 144 is formed, a dielectric layer may be formed (S10). After the dielectric layer is formed, the lower electrode may be formed (S30). Referring to FIG. 4, a dielectric layer 150 and a first lower conductive layer 160 may be sequentially formed conformally with a surface of the sacrificial layer 144 in which the opening 146 is defined.

The dielectric layer 150 may be formed by vapor-depositing a high-k material on surfaces of the sacrificial layer 144 and the etch stop layer 142. The dielectric layer 150 may be formed to a thickness of about 50 to 150 Å. For example, the dielectric layer 150 may be a monolayer of any one selected from a metal oxide such as $HfO_2$, $ZrO_2$, $AlO_3$, $La_2O_3$, $Ta_2O_3$ and $TiO_2$, and a dielectric material having a perovskite structure, such as $SrTiO_3$(STO), $(Ba,Sr)TiO_3$(BST), $BaTiO_3$, lead zirconate titanate (PZT), and lanthanum-doped lead zirconate titanate (PLZT), or may be a combination of those layers. The dielectric layer 150 may be formed by the film formation technology having excellent step coverage property, such as CVD or ALD.

Further, referring to FIG. 1, a first heat treatment process may be performed (S20) to improve the dielectric characteristics before the lower electrode is formed. An equivalent oxide thickness of the first dielectric layer 150 may be reduced by the first heat treatment performed at a high temperature. A crystalline state of the dielectric layer 150 may also be changed so that the dielectric layer 150 may have a high dielectric constant. The heat-treated dielectric layer 150 may have the dielectric constant of about 50 or higher and the equivalent oxide thickness of about 5 Å or less.

The first heat treatment may be performed for about 5 seconds to several hours at the temperature of about 500° C. to 1000° C. The heat treatment may be performed in the oxygen atmosphere using a gas mixture containing at least one selected from oxygen, nitride, hydrogen, ammonia, argon and $N_2O$. Also, the heat treatment may be performed in a rapid thermal annealing (RTA) equipment or in a furnace. The heat treatment may be a rapid heat treatment using plasma.

For example, when the dielectric layer 150 is a $TiO_2$ layer, the $TiO_2$ dielectric layer 150 formed by CVD or ALD may have an anatase crystalline structure. The $TiO_2$ dielectric layer 150 having the anatase crystalline structure may change to a rutile crystalline structure at the temperature of about 500 to 1000° C. The high-temperature first heat treatment may enable formation of the $TiO_2$ dielectric layer 150 having a rutile crystalline structure having a high dielectric constant of about 100 or higher.

Meanwhile, the contact plug 132 is covered with the etch stop layer 142 including a conductive material during the first heat treatment. Therefore, deformation or oxidation of the contact plug 132 by the high-temperature first heat treatment may be prevented.

After the first heat treatment, the first lower conductive layer 160 may be formed by vapor-depositing a metal on a surface of the dielectric layer 150.

The first lower conductive layer 160 may be formed of a conductive material which has excellent step coverage property and oxidation resistant property and does not easily deform during subsequent processes. The first lower conductive layer 160 may be made of a conductive material having a greater work function than polysilicon. For example, the first lower conductive layer 160 may be made of a metal nitride layer including at least one of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN) and tungsten nitride (WN). Also, the first lower conductive layer 160 may be made of a noble metal layer including at least one of platinum (Pt), ruthenium (Ru), and iridium (Ir). The first lower conductive layer 160 may also be made of a conductive noble metal oxide such as PtO, $RuO_2$, or $IrO_2$, or a conductive oxide such as SRO($SrRuO_3$), BSRO (($Ba,Sr$)$RuO_3$), CRO ($CaRuO_3$), or LSCO (($La,Sr$)$CoO_3$).

The first lower conductive layer 160 may be formed by a film formation technology having excellent step coverage property, such as CVD or ALD, and may be vapor-deposited to a thickness of about 10 Å to 100 Å.

After formation of the first lower conductive layer 160, a plasma treatment and a second heat treatment may be performed (S40) to remove impurities generated during the formation of the first lower conductive layer 160 with minimal influence to the dielectric layer 150. $N_2$ and $H_2$ plasma may be used for the plasma treatment. The second heat treatment may be performed at a lower temperature than the first heat treatment to prevent reaction between the first lower conductive layer 160 and the dielectric layer 150 and deformation of the first lower conductive layer 160. Since the first lower conductive layer 160 formed as a metal nitride layer or a noble metal layer may deteriorate at about 500° C. or higher, the second heat treatment, which is performed after formation of the first lower conductive layer 160, may be performed at lower than about 500° C. In addition, other subsequent processes after the formation of the first lower conductive layer 160 may be performed at lower than about 500° C. to prevent deterioration of the first lower conductive layer 160 (that is, lower electrode).

Figure 5:
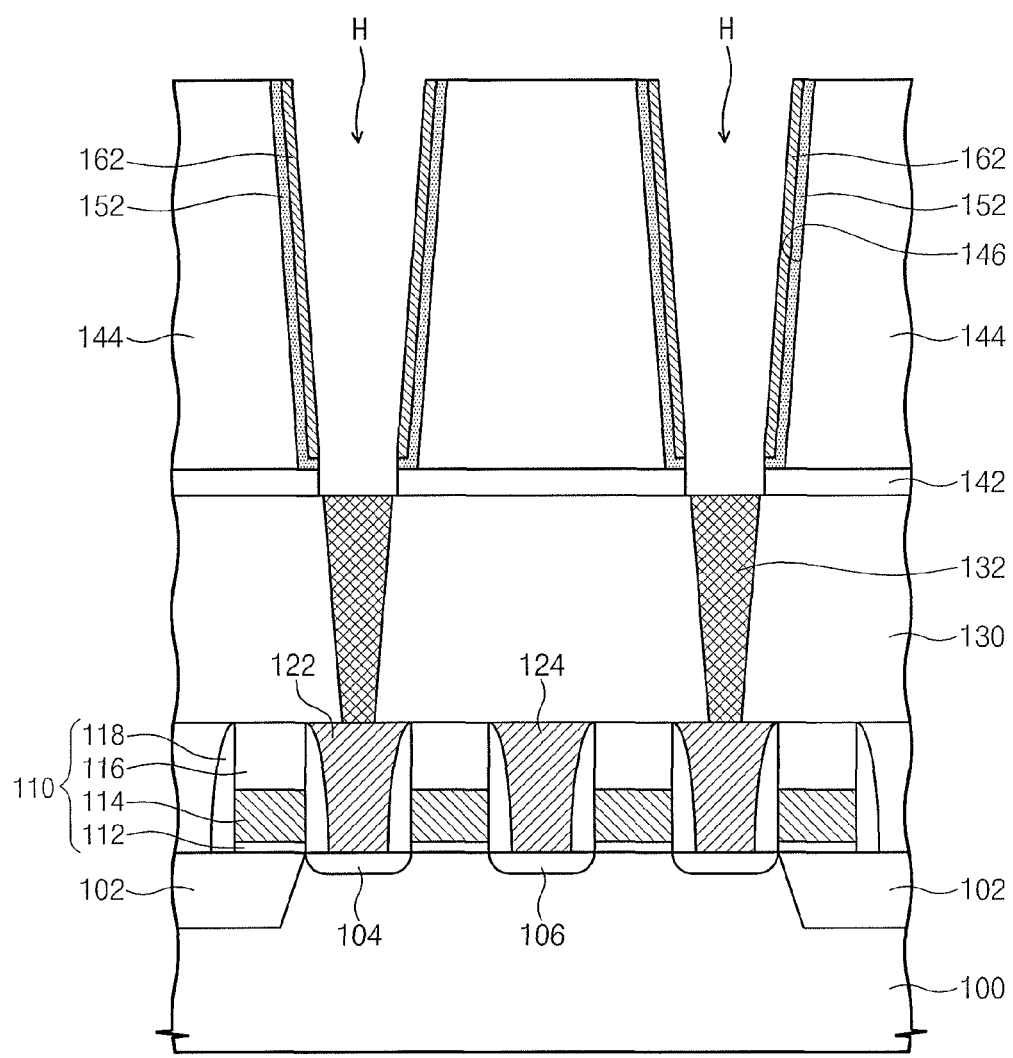

Referring to FIG. 5, isotropic etching may be performed to the dielectric layer 150, the first lower conductive layer 160, and the etch stop layer 142, thereby forming a hole H that exposes the contact plug 132.

More specifically, the dielectric layer 150 and the first lower conductive layer 160 may be etch-backed, thereby exposing the etch stop layer 142 disposed at a lower surface of the opening 146. As the etch-back is performed, the dielectric layer 150 and the first lower conductive layer 160 may be removed from an upper portion of the sacrificial layer 144 and a bottom portion of the opening 146. Thus, a high-k dielectric pattern 152 and a first lower conductive layer pattern 162 are provided on a sidewall of the opening. The high-k dielectric pattern 152 disposed between the first lower conductive layer pattern 162 and the sacrificial layer 144 may partially cover the bottom of the opening 146. The high-k dielectric pattern 152 may have a pillar shape including a hole therein. For example, the high-k dielectric pattern 152 may have a hollow, substantially cylindrical shape. As used herein, the term "pillar shape' includes shapes that are cylindrical and also shapes in which the side surface is tapered or inclined, such as frustoconical or inverted-frustoconical shapes. For example, the term "pillar shape" may include a shape in width of the shape decreases toward a lower part of the shape, as may be obtained, for example, in the forming of the opening 146 by isotropic etching. Also, a bottom of the high-k dielectric pattern 152 may extend up to a surface of the etch stop layer 142. That is, the high-k dielectric pattern 152 may have an L-shape section.

The first lower conductive layer pattern 162 may be disposed on the bottom of the high-k dielectric pattern 152. The first lower conductive layer pattern 162 may prevent damage of the high-k dielectric pattern 152 during the isotropic etching.

After the etch stop layer 142 at the bottom of the opening 146 is exposed, the etch stop layer 142 may be removed and an upper surface of the contact plug 132 may be exposed due to over-etching.

Figure 6:
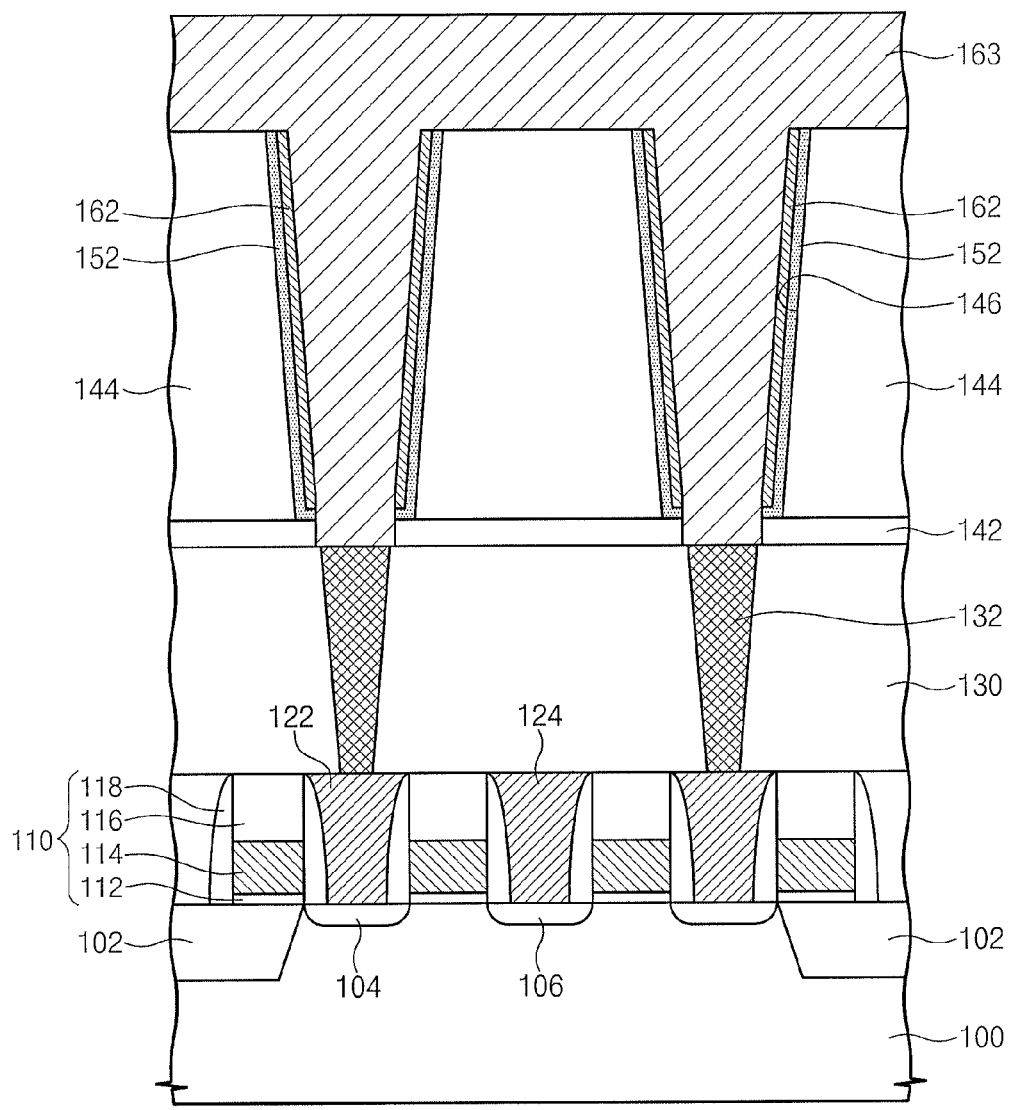

Referring to FIG. 6, a second lower conductive layer 163 may be formed in the hole H through which the contact plug 132 is exposed.

Specifically, the second lower conductive layer 163 may directly contact the first lower conductive layer 162 and the contact plug 132. The second lower conductive layer 163 may be formed of the same metal material as the first lower conductive layer 162. For example, the second lower conductive layer 163 may be any one of a metal nitride layer, a noble metal layer, a conductive noble metal oxide layer, and a conductive oxide layer.

The second lower conductive layer 163 may be formed by a film formation technology having excellent step coverage property, such as CVD or ALD. The second lower conductive layer 163 may be vapor-deposited to a thickness of ½ or greater of an upper width of the opening 146.

Figure 12:
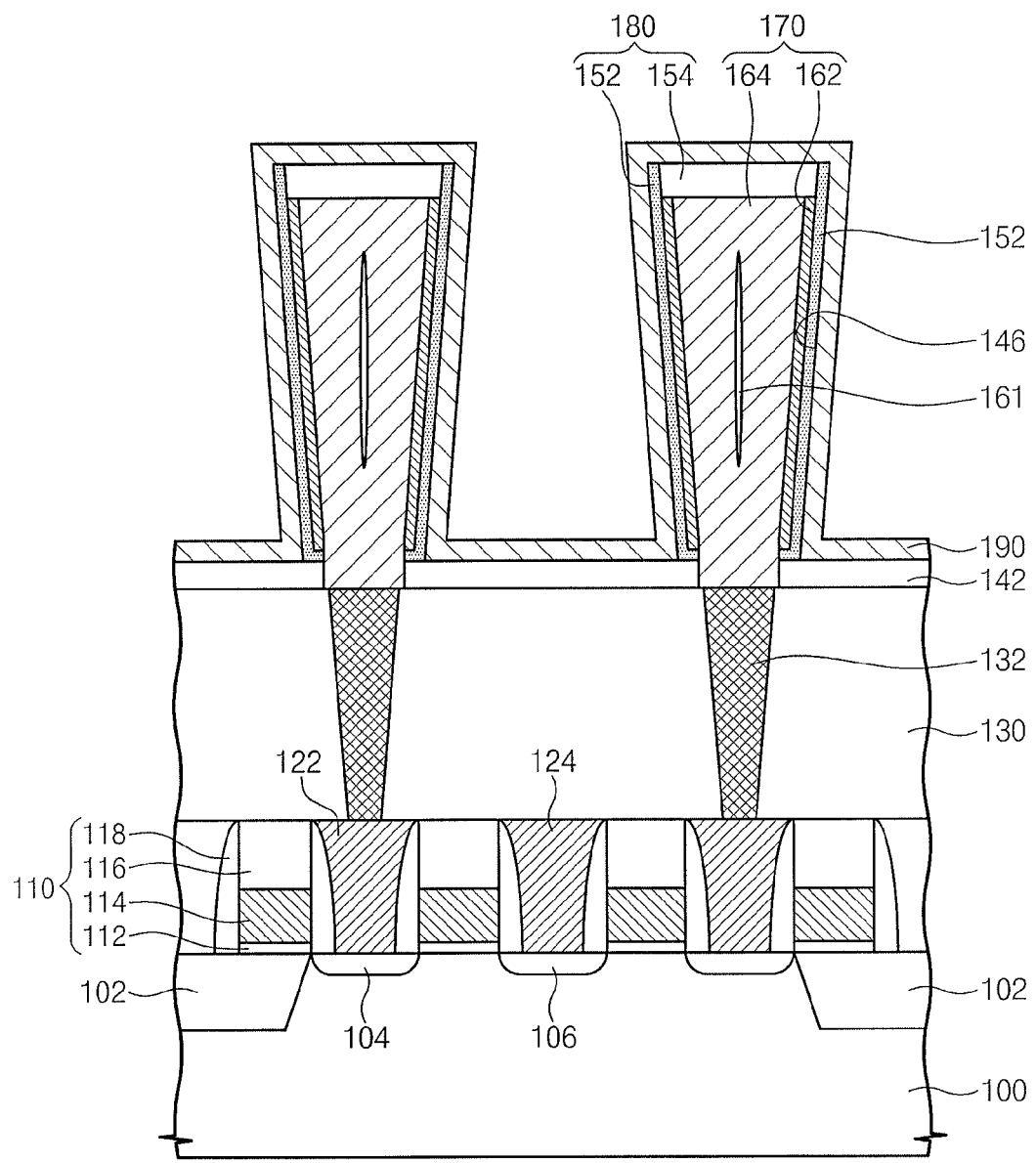
FIG. 12 illustrates a sectional view of a semiconductor memory device manufactured by the semiconductor memory device manufacturing method according to the embodiment.

The second lower conductive layer 163 formed by vapor-deposition may directly contact the first lower conductive layer 162 and the contact plug 132 and may block an entrance of the opening 146. The second lower conductive layer 163 may fully fill an inside of the opening 146. In a case where an aspect ratio of the opening 146 is great, when the second lower conductive layer 163 is vapor-deposited, a void 161 or a seam may be generated in a central part of the opening 146 as shown in FIG. 12.

Figure 7:
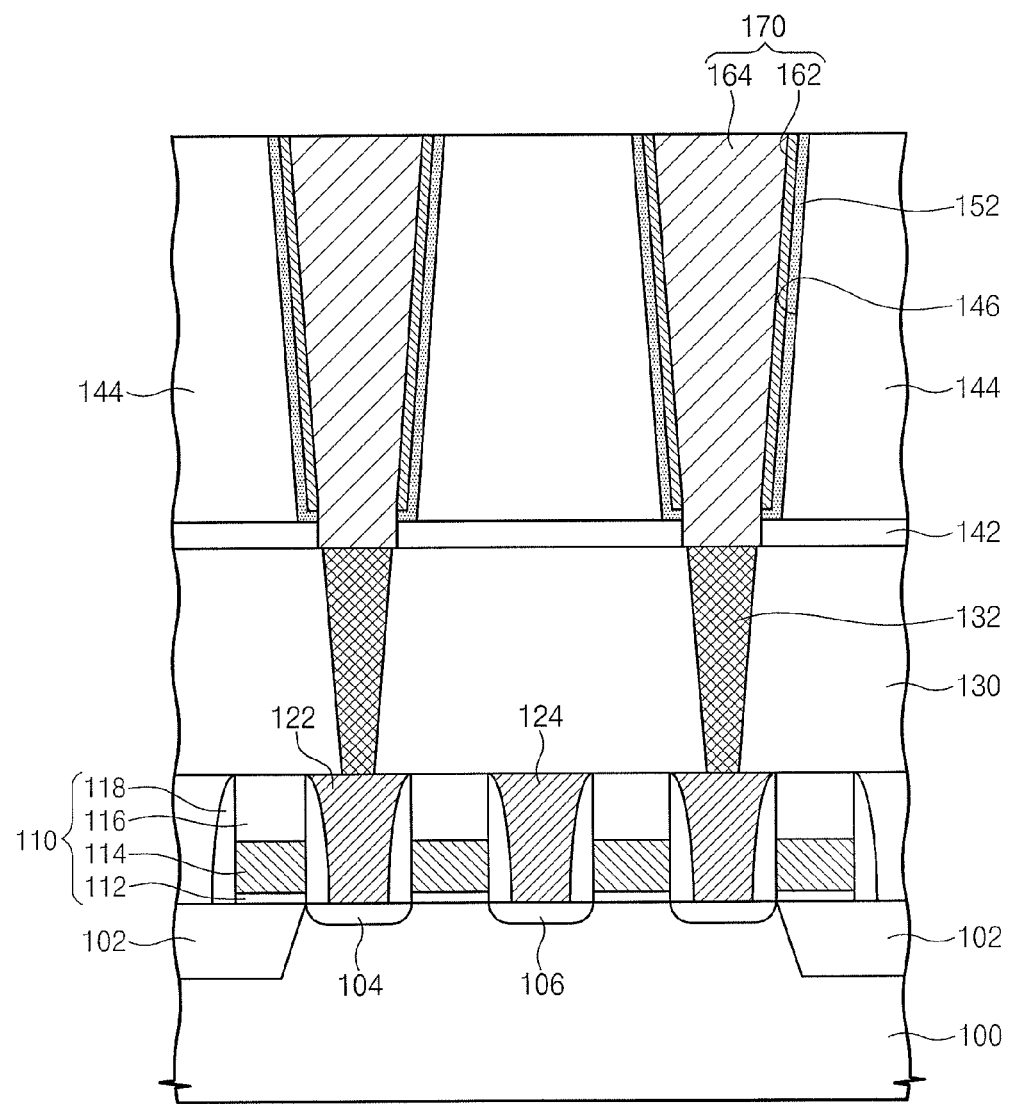

Referring to FIG. 7, the second lower conductive layer 163 may be planarized, thereby locally forming a second lower conductive layer pattern 164 in the opening 146.

The upper surface of the sacrificial layer 144 may be exposed by the planarization of the second lower conductive layer 163. The second lower conductive layer 163 may be separated into the second lower conductive layer patterns 164 locally formed in the opening 146. That is, when a plurality of openings 146 are formed in the forming of a plurality of capacitors at the same time, a second lower conductive pattern 164 is provided in each opening 146. The planarization of the second lower conductive layer 163 may be performed sufficiently to expose an upper surface of the high-k dielectric pattern 152. Since the second lower conductive layer 163 may be made of the same material as the first lower conductive layer 162, the first lower conductive layer 162 may also be planarized along with the second lower conductive layer 163 during the planarization.

When the second lower conductive layer 164 is formed, a lower electrode 170 including the first and second lower conductive layer patterns 162 and 164 may be provided in the opening 146. That is, the first lower conductive layer 162 and the second lower conductive layer 164 may be collectively referred to as the "lower electrode 170", and the high-k dielectric pattern 152 and the lower electrode 170 are provided in the opening 146. The sacrificial layer 144, the high-k dielectric pattern 152, and the lower electrode 170 may have planarized upper surfaces.

Figure 8:
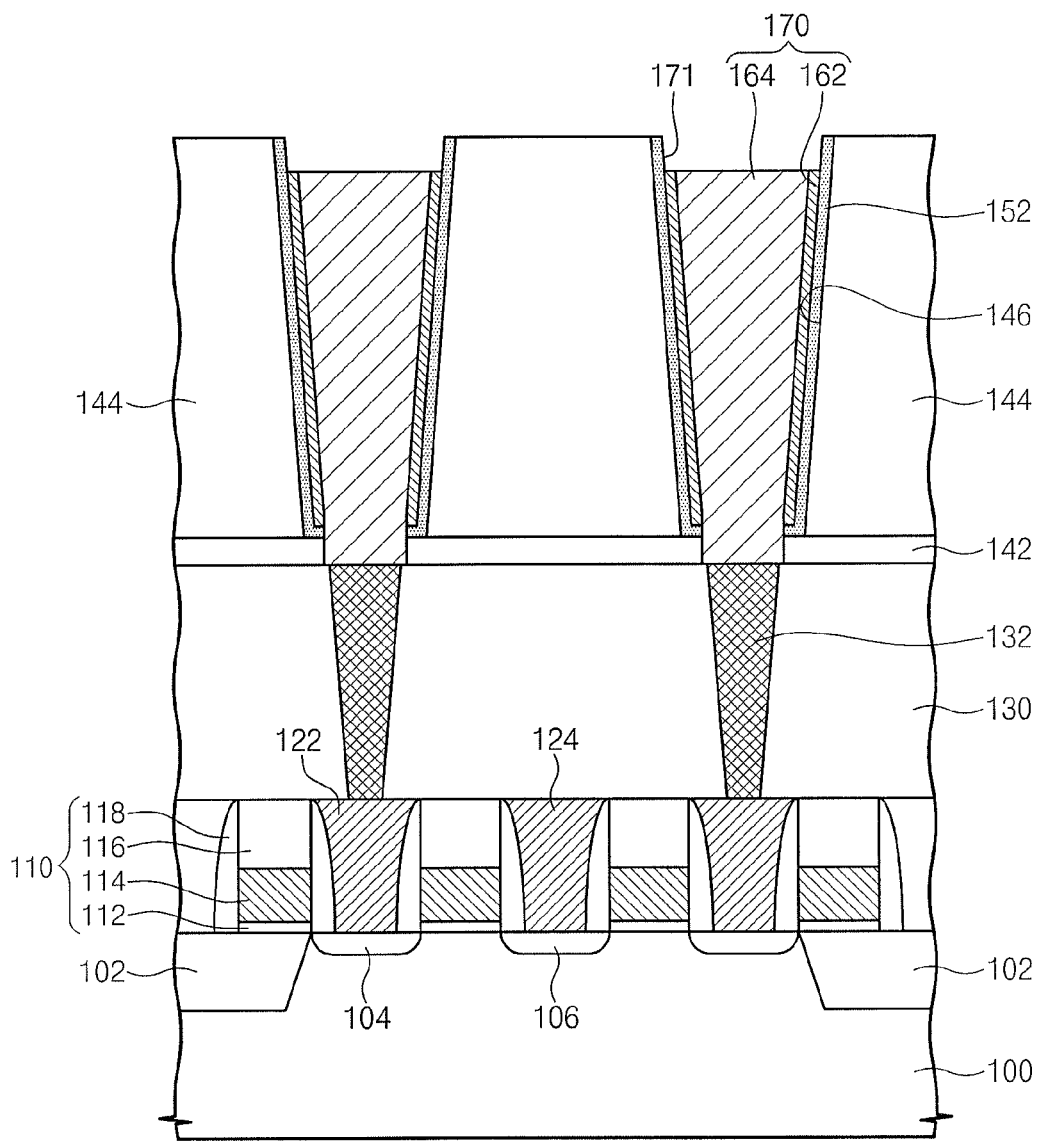
Figure 9:
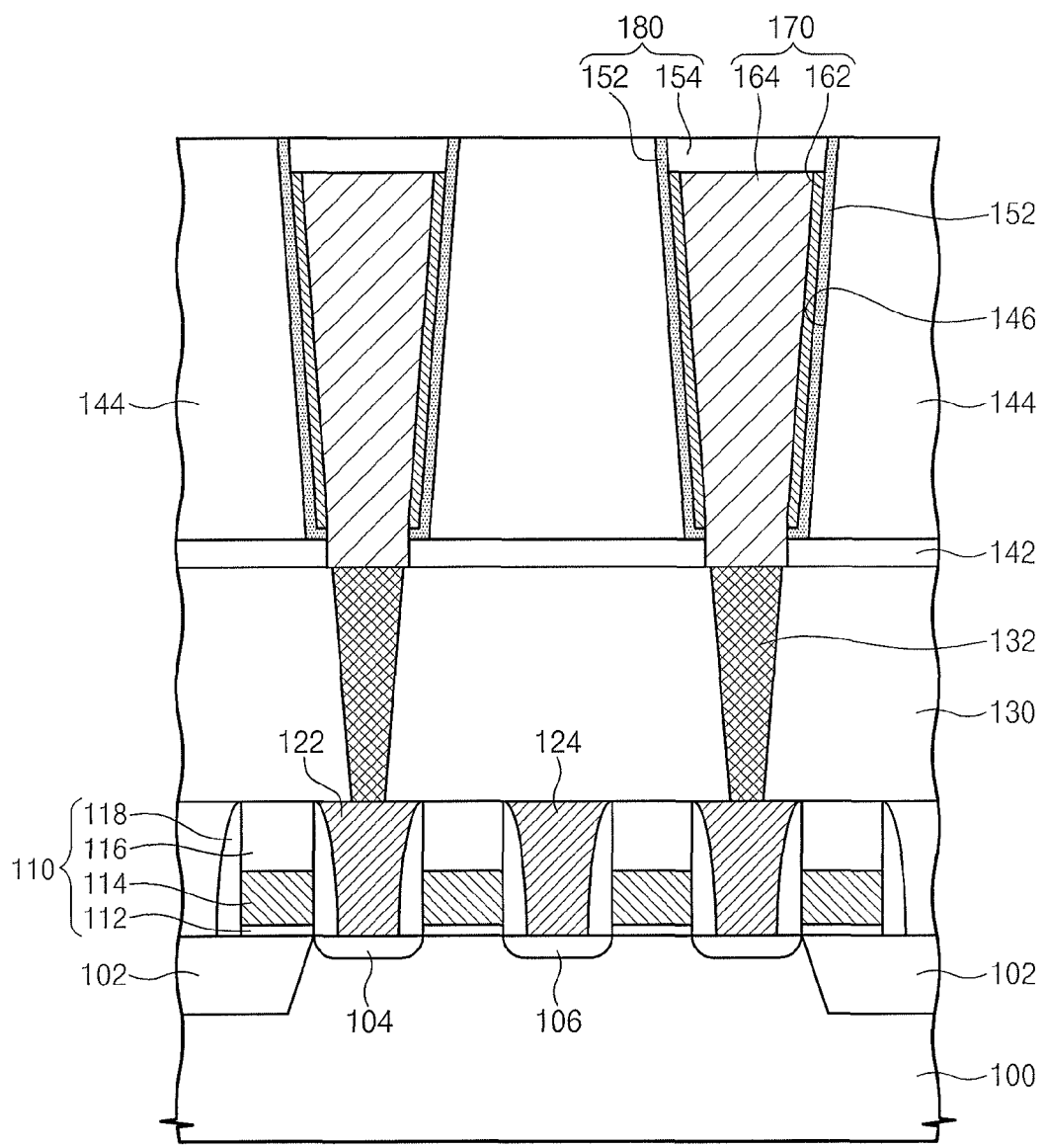

Referring to FIG. 8, after the lower electrode 170 is formed, an upper part of the lower electrode 170 may be selectively etched, thereby forming a recess region 171. A depth of the recess region 171 at the upper part of the lower electrode 170 may be greater than a thickness of the high-k dielectric pattern 152. For example, the depth of the recess region 171 may be about 100 Å to 1000 Å. As the upper part of the lower electrode 170 is recessed, an upper surface of the lower electrode 170 may be disposed lower than the upper surface of the high-k dielectric pattern 152. Additionally, an upper part of a sidewall of the high-k dielectric pattern 152 may be exposed by the recess region 171.

Referring to FIGS. 1 through 9, a blocking insulating pattern 154 may be formed in the recess region 171 on the lower electrode 170 (S50). The blocking insulating pattern 154 covering the upper surface of the lower electrode 170 may constitute a capacitor dielectric layer 180 along with the high-k dielectric pattern 152 covering the sidewall of the lower electrode 170.

The blocking insulating pattern 154 may be made of an insulating material having an etch selectivity with respect to the sacrificial layer 144. The blocking insulating pattern 154 may be formed by vapor-depositing the insulating material on the recessed lower electrode 170 and planarizing the insulating material until the sacrificial layer 144 is exposed. A thickness of the blocking insulating pattern 154 may be greater than the thickness of the high-k dielectric pattern 152 disposed between the sidewall of the sacrificial layer 144 and the lower electrode 170. That is, the blocking insulating pattern 154 may have a thickness of about 100 Å to 1000 Å.

If the sacrificial layer 144 is a polysilicon layer, the blocking insulating pattern 154 may be formed of a silicon oxide layer, a silicon nitride layer, or a metal oxide layer such as $Ta_2O_5$, $TiO_2$, ZrO, and HfO. If the sacrificial layer 144 is a silicon oxide layer, the blocking insulating pattern 154 may be formed of a silicon nitride layer or a metal oxide layer such as $Ta_2O_5$, $TiO_2$, ZrO, and HfO. If the sacrificial layer 144 is made of a polymer-based material removed by dry etching in an oxygen atmosphere, the blocking insulating pattern 154 may be formed of an insulating material that is not removed by the oxygen-atmosphere dry etching.

The blocking insulating pattern 154 may be formed of a material having the same chemical composition as the high-k dielectric pattern 152. If the blocking insulating pattern 154 is formed of the same material as the high-k dielectric pattern 152, the blocking insulating pattern 154 may be formed without a high-temperature heat treatment. Therefore, the blocking insulating pattern 154 may have a different dielectric constant from the high-k dielectric pattern 152. That is, a dielectric constant of the blocking insulating pattern 154 may be lower than a dielectric constant of the high-k dielectric pattern 152.

Figure 10:
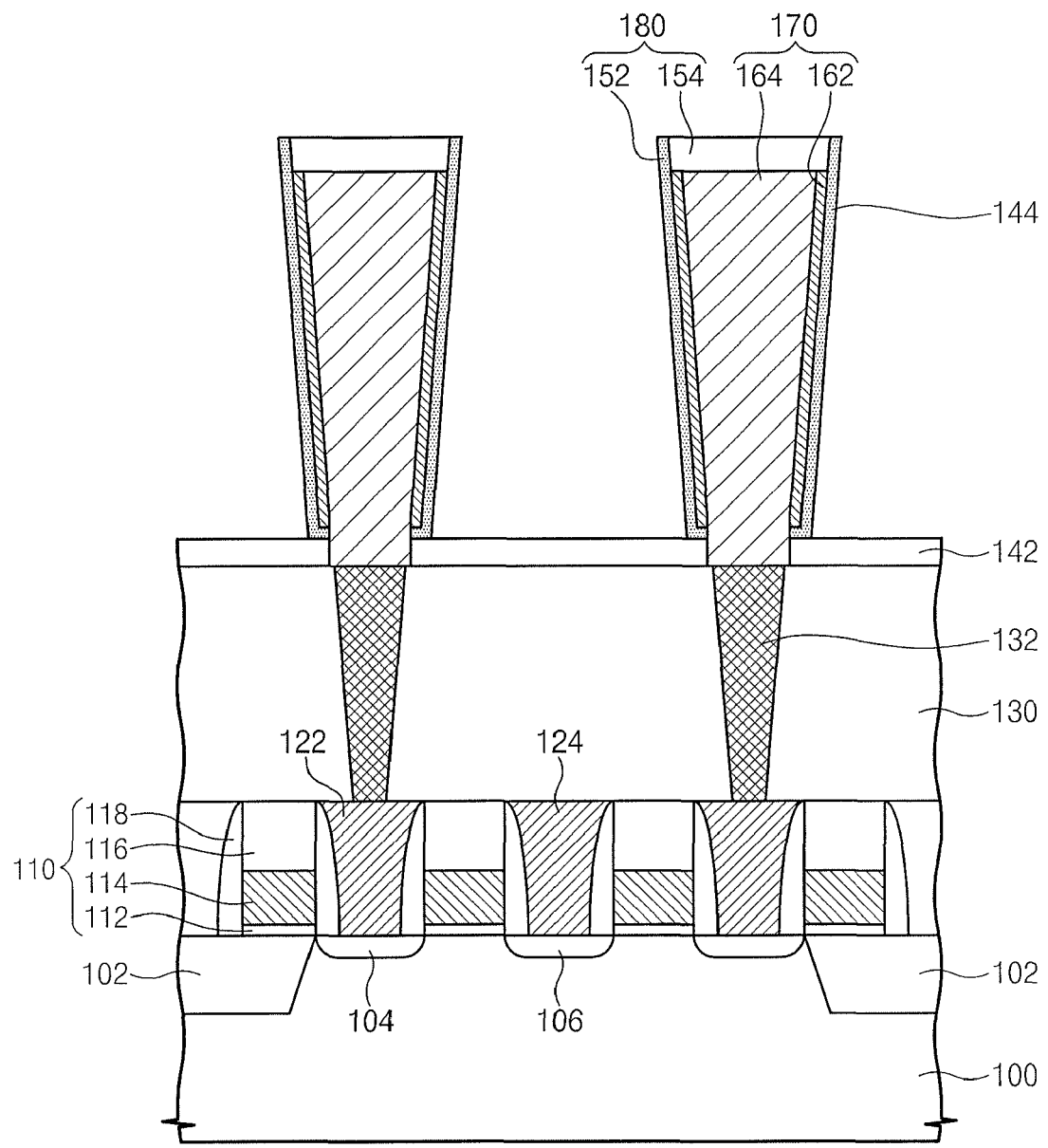

Referring to FIG. 10, the sacrificial layer 144 may be removed such that a surface of the capacitor dielectric layer 180 is exposed. The sacrificial layer 144 may be removed by dry etching or wet etching.

When the sacrificial layer 144 is a silicon oxide layer, wet etching using an etchant which contains hydrofluoric acid may be performed to remove the sacrificial layer 144. When the sacrificial layer 144 is a silicon nitride layer, wet etching using an etchant which contains phosphoric acid may be performed to remove the sacrificial layer 144. When the sacrificial layer 144 is a polysilicon layer, wet etching using a polysilicon etchant capable of selectively removing polysilicon may be performed to remove the sacrificial layer 144. Furthermore, when the sacrificial layer 144 is formed of a polymer-based material, dry etching may be performed in the oxygen atmosphere to remove the sacrificial layer 144.

Figure 11:
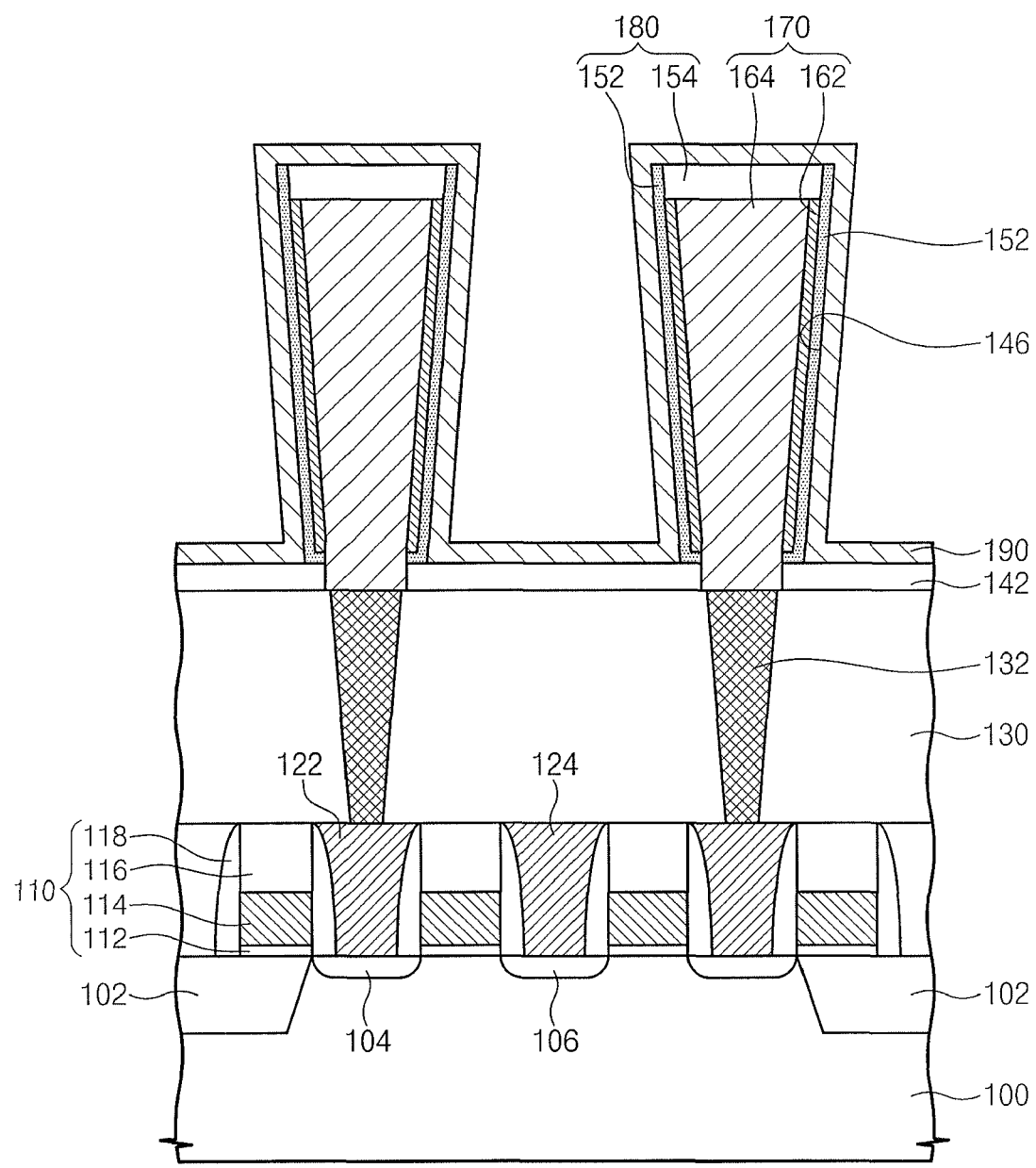

Referring to FIG. 1 and FIG. 11, an upper electrode 190 may be formed on the high-k dielectric pattern 152 and the blocking insulating pattern 154 (S60).

The upper electrode 190 may be formed by vapor-depositing a conductive material conformally with a surface of a structure resulting from the removal of the sacrificial layer 144. That is, the upper electrode 190 may conformally cover surfaces of the high-k dielectric pattern 152 and the blocking insulating pattern 154.

The upper electrode 190 may be formed of a conductive material that has an excellent step coverage property and oxidation resistant property and does not easily deform during subsequent processes. In addition, the upper electrode 190 may be made of a conductive material having a greater work function than polysilicon. For example, the upper electrode 190 may be made of a metal nitride layer including at least one of TiN, TiSiN, TiAlN, TaN, TaSiN, TaAlN and WN. Also, the upper electrode 190 may be made of a noble metal layer including at least one of Pt, Ru, and Ir. The upper electrode 190 may also be made of a conductive noble metal oxide such as PtO, $RuO_2$, or $IrO_2$, or a conductive oxide such as SRO($SrRuO_3$), BSRO(($Ba,Sr$)$RuO_3$), CRO ($CaRuO_3$), or LSCO.

The upper electrode 190 may be formed by a film formation technology having excellent step coverage property, such as CVD or ALD, and may be vapor-deposited to a thickness of about 10 Å to 100 Å.

Referring to FIG. 1, after formation of the upper electrode 190, a plasma treatment and a third heat treatment may be performed (S70) to remove impurities generated during the formation of the upper electrode 190 with minimal influence to the capacitor dielectric layer 180. $N_2$ and $H_2$ plasma may be used for the plasma treatment. The third heat treatment may be performed at a lower temperature than the first heat treatment to prevent reaction between the capacitor dielectric layer 180 and the lower and upper electrodes 170 and 190 and also to prevent deformation of the lower and upper electrodes 170 and 190. For example, the third heat treatment, which is performed after formation of the upper electrode 190, may be performed at lower than about 500° C.

FIG. 12 illustrates a sectional view of a semiconductor memory device manufactured by the semiconductor memory device manufacturing method according to the embodiment.

Referring to FIG. 12, the gate electrodes 110 may be disposed on the semiconductor substrate 100 defined into a field region and an active region by the device isolation layer 102. The source/drain regions 104 and 106 may be disposed among the gate electrodes 110 on the semiconductor substrate 100. The gate electrode 110 may include the gate dielectric layer 112, the gate conductive layer 114, the capping dielectric layer 116, and the spacers 118.

The first interlayer dielectric may be disposed on the gate electrodes 110. The contact pads 122, which electrically connect the drain regions 104 with the lower electrodes 170, and the contact pads 124, which electrically connect the source regions 104 with the bit lines (not shown), may be formed in the first interlayer dielectric.

The second interlayer dielectric 130 may be disposed on the contact pads 122 and 124. The contact plugs 132 for the lower electrodes 170 may be formed in the second interlayer dielectric 130. In addition, the bit lines (not shown) may be formed in the second interlayer dielectric 130.

A metal-insulator-metal (MIM) capacitor may be formed on the second interlayer dielectric 130 including the lower electrode contact plugs 132, in electrical connection with the lower electrode contact plugs 132. The capacitor may include the lower electrode 170 having a pillar shape and directly contacting the lower electrode contact plug 132, the capacitor dielectric layer 180 covering a sidewall and an upper surface of the lower electrode 170, and the upper electrode 190 disposed on the capacitor dielectric layer 180.

The lower electrode 170 may be brought into direct contact with the lower electrode contact plug 132 through the etch stop layer 142 disposed on the surface of the second interlayer dielectric 130. The lower electrode 170 may be divided into a lower portion penetrating the etch stop layer 142 and an upper portion disposed at the upper part of the etch stop layer 142. A lower sidewall of the lower electrode 170 may directly contact the etch stop layer 142 while an upper sidewall of the lower electrode 170 may directly contact the high-k dielectric pattern 152.

The upper electrode 190 may be conformally formed with surfaces of the etch stop layer 142 and the capacitor dielectric layer 180. Since the capacitor dielectric layer 180 may be disposed on the sidewall and the upper surface of the lower electrode 170, the upper electrode 190 may directly contact the etch stop layer 142.

The lower electrode 170 and the upper electrode 190 may be made of a conductive material having a greater work function than polysilicon. For example, the lower and upper electrodes 170 and 190 may be made of a metal nitride layer including at least one of TiN, TiSiN, TiAlN, TaN, TaSiN, TaAlN, and WN. In addition, the lower and upper electrodes 170 and 190 may be made of a noble metal layer including at least one of Pt, Ru, and Ir. The lower and upper electrodes 170 and 190 may also be made of a conductive noble metal oxide such as PtO, $RuO_2$, or $IrO_2$, or a conductive oxide such as $SRO(SrRuO_3)$, BSRO $((Ba,Sr)RuO_3)$, CRO $(CaRuO_3)$, or LSCO.

According to one embodiment, the capacitor dielectric layer 180 may cover the surface of the lower electrode 170 on the etch stop layer 142. The capacitor dielectric layer 180 includes the high-k dielectric pattern 152 disposed on the sidewall of the lower electrode 170 and the blocking insulating pattern 154 disposed on the upper surface of the lower electrode 170. In other words, the high-k dielectric pattern 152 and the blocking insulating pattern 154 may collectively be referred to as the "capacitor dielectric layer 180."

The high-k dielectric pattern 152 of the capacitor dielectric layer 180 may have a thickness of about 50 Å to 150 Å and an equivalent oxide thickness of about 5 Å or less. The high-k dielectric pattern 152 may have a pillar shape including a hole therein. For example, the high-k dielectric pattern 152 may have a hollow, substantially cylindrical shape. A bottom of the high-k dielectric pattern 152 may extend up to the surface of the etch stop layer 142. That is, the high-k dielectric pattern 152 may have a substantially L-shape section. The high-k dielectric pattern 152 of the capacitor dielectric layer 180 may be a monolayer of a metal oxide such as $HfO_2$, $ZrO_2$, $AlO_3$, $La_2O_3$, $Ta_2O_3$ and $TiO_2$, or $(Ba,Sr)TiO_3(BST)$, or may be a combination of those layers. In addition, the high-k dielectric pattern 152 formed before formation of the lower electrode 170 may be a dielectric layer crystallized by a heat treatment performed at a high temperature of about 500° C. or higher. Accordingly, the high-k dielectric pattern 152 may be formed of a material having a high dielectric constant of about 50 or higher. For example, the high-k dielectric pattern 152 may be a $TiO_2$ dielectric layer having a rutile crystalline structure.

The blocking insulating pattern 154 may be formed before the upper electrode 190 is formed so as to prevent electrical short between the lower electrode 170 and the upper electrode 190. As explained with respect to FIG. 9, the blocking insulating pattern 154 may be made of a material having a lower dielectric constant than the high-k dielectric pattern 152. For example, the blocking insulating pattern 154 may be made of a silicon oxide layer, a silicon nitride layer, or a metal oxide layer such as $Ta_2O_5$, $TiO_2$, ZrO, or HfO.

The blocking insulating pattern 154 may be formed of a material having the same chemical composition as the high-k dielectric pattern 152. In this case, the blocking insulating pattern 154 and the high-k dielectric pattern 152 may have different crystalline structures from each other. For example, the blocking insulating pattern 154 of the capacitor dielectric layer 180 may be a $TiO_2$ dielectric layer having the anatase crystalline structure having a lower dielectric constant than a $TiO_2$ dielectric layer having the rutile crystalline structure.

When the blocking insulating pattern 154 having a lower dielectric constant than the high-k dielectric pattern 152 is formed and when a predetermined voltage is applied to the capacitor, a current leakage wherein electric charges pass through the blocking insulating pattern 154 may increase. Therefore, according to the embodiments described herein, the blocking insulating pattern 154 may be formed thicker than the high-k dielectric pattern 152. For example, the blocking insulating pattern 154 may have a thickness of about 100 Å to 1000 Å.

Hereinafter, a method of manufacturing a capacitor of a semiconductor memory device according to another embodiment will be described with reference to FIGS. 13 and 15.

Figure 13:
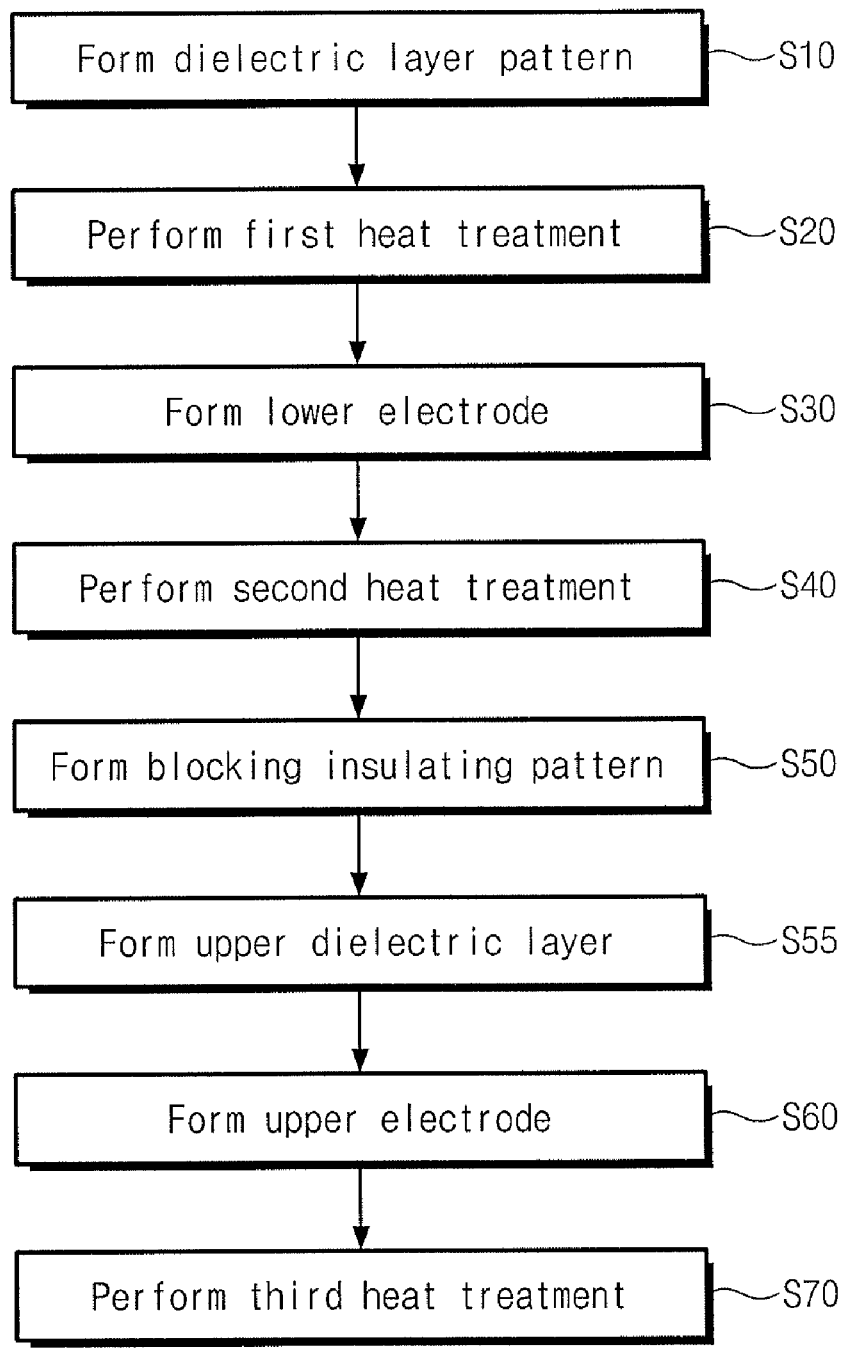
FIG. 13 illustrates a flowchart illustrating a method of manufacturing a capacitor of a semiconductor memory device, according to another embodiment.
Figure 14:
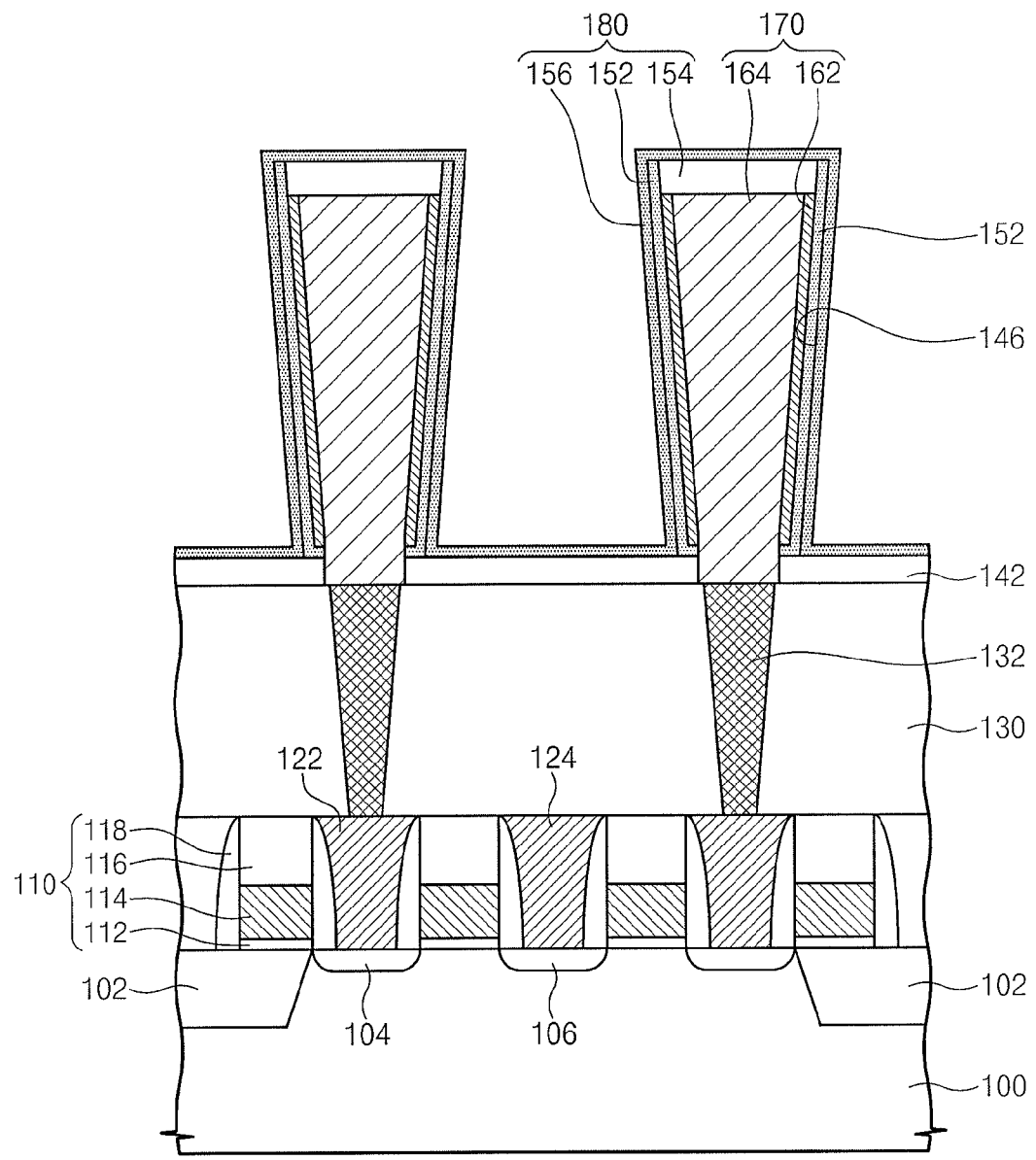
FIGS. 14 and 15 illustrate sectional views illustrating the capacitor manufacturing method according to the embodiment of FIG. 13.

FIG. 13 illustrates a flowchart illustrating the capacitor manufacturing method according to another embodiment. FIGS. 14 and 15 illustrate sectional views illustrating the capacitor manufacturing method according to another embodiment.

According to the present embodiment, an upper dielectric layer 156 may be additionally formed on the high-k dielectric pattern 152 after the sacrificial layer 144 is removed to expose the surface of the high-k dielectric pattern 152, as shown in FIG. 10.

Referring to FIGS. 13 and 14, the upper dielectric layer 156 may be formed conformally with a surface of a structure resulting from the removal of the sacrificial layer 144 (S55). According to another embodiment, the upper dielectric layer 156 may constitute the capacitor dielectric layer 180 along with the high-k dielectric pattern 152 and the blocking insulating pattern 154.

The upper dielectric layer 156 may be conformally formed on the etch stop layer 142, the high-k dielectric pattern 152, and the blocking insulating pattern 154. The upper dielectric layer 156 may be disposed on the surface of the high-k dielectric pattern 152 and extended to upper surfaces of the etch stop layer 142 and the blocking insulating pattern 154. A total sum of thicknesses of the high-k dielectric pattern 152 and the upper dielectric layer 156 may be about 50 Å to 150 Å. The upper dielectric layer 156 may be a monolayer of a metal oxide such as $HfO_2$, $ZrO_2$, $AlO_3$, $La_2O_3$, $Ta_2O_3$, $TiO_2$, $SrTiO_3$ (STO), or $(Ba,Sr)TiO_3$(BST). The upper dielectric layer 156 may be formed by a film formation technology having excellent step coverage property, such as CVD or ALD. The upper dielectric layer 156 may be vapor-deposited at a temperature equal to or lower than 500° C. to prevent deterioration of the lower electrode 170.

When vapor-deposited, the upper dielectric layer 156 may be epitaxially grown by using the high-k dielectric pattern 152 as a seed. Since the high-k dielectric pattern 152 may be a dielectric layer crystallized by the high-temperature first heat treatment performed before formation of the lower electrode 170, the upper dielectric layer 156 grown using the high-k dielectric pattern 152 as a seed may have the same crystalline structure as the high-k dielectric pattern 152. For example, when the high-k dielectric pattern 152 is a $TiO_2$ layer having a rutile crystalline structure, the upper dielectric layer 156 may also be a $TiO_2$ layer having a rutile crystalline structure. The upper dielectric layer 156 may be a high-k dielectric layer having a dielectric constant of about 50 or higher.

Figure 15:
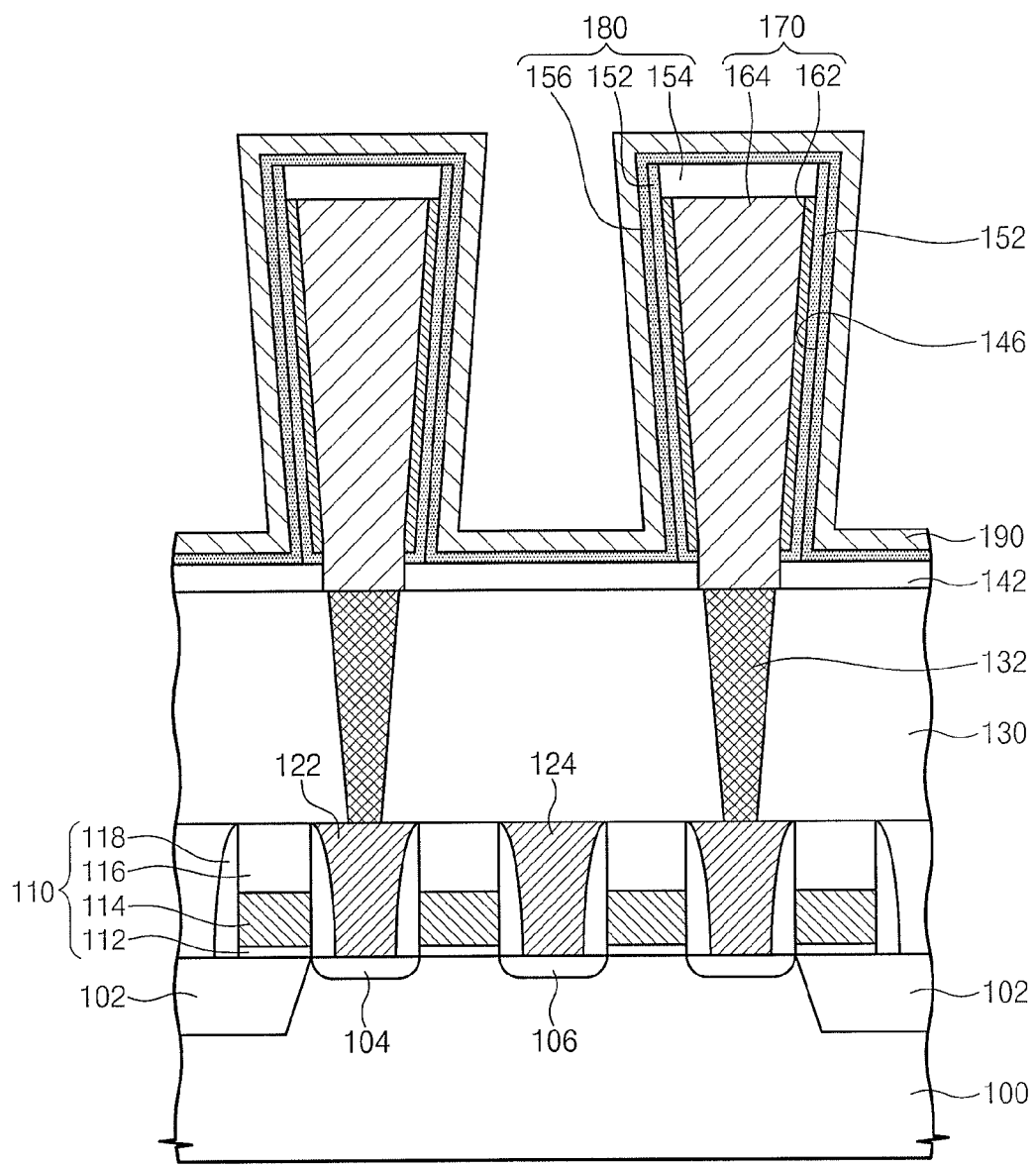

Referring to FIG. 15, after the upper dielectric layer 156 is formed, the upper electrode 190 may be conformally formed as explained with reference to FIG. 11 (S60). Additionally, the third heat treatment and the plasma treatment may be performed to remove impurities after formation of the upper electrode 190. The MIM capacitor may accordingly be completed. The capacitor dielectric layer 180 in the MIM capacitor according to the embodiment of FIG. 13-15 may include the high-k dielectric pattern 152, the blocking insulating pattern 154, and the upper dielectric layer 156. The high-k dielectric pattern 152 and the upper dielectric layer 156 may be high-k dielectric layers having a dielectric constant of about 50 or higher whereas the blocking insulating pattern 154 may be a low-k dielectric layer having a lower dielectric constant than the high-k dielectric pattern 152.

Since the blocking insulating pattern 154 having the low dielectric constant may be disposed on the upper surface of the lower electrode 170, the capacitor dielectric layer 180 may be thicker at the upper surface of the lower electrode 170 than at the sidewall of the lower electrode 170. For example, the thickness of the capacitor dielectric layer 180 may be about 50 Å to 150 Å at the sidewall of the lower electrode 170 while being about 100 Å to 1000 Å at the upper surface of the lower electrode 170.

Figure 16:
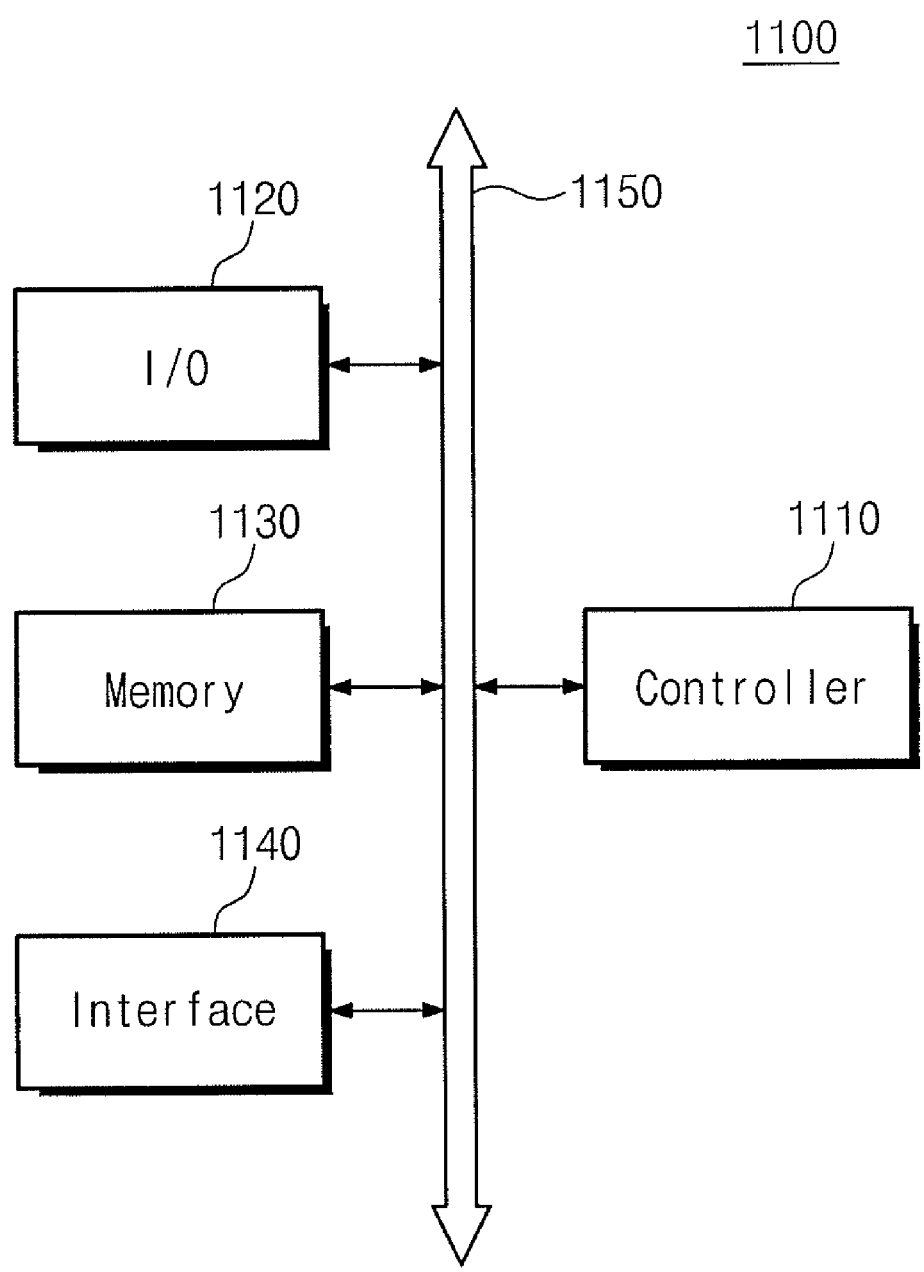
FIG. 16 illustrates a block diagram schematically showing a memory system including the semiconductor memory device manufactured according to the embodiments.

FIG. 16 is a block diagram schematically showing a memory system including the semiconductor memory device manufactured according to the embodiments of the inventive concept.

Referring to FIG. 16, the memory system 1100 may be applied to a personal digital assistant (PDA), a portable computer, a tablet, a wireless phone, a mobile phone, a digital music player, a memory card, or any other device capable of wirelessly transmitting and receiving data.

The memory system 1100 may include a controller, 1110, an input/output device 1120 such as a keypad, a keyboard, and a display, a memory 1130, an interface 1140, and a bus 1150. The memory 1130 and the interface 1140 may communicate with each other through the bus 1150.

The controller 1110 may include at least one microprocessor, a digital signal processor, a micro controller, or other similar processors. The memory 1130 may store commands carried out by the controller 1110. The input/output device 1120 may output and receive data or signals to and from the outside of the system 1100. For example, the input/output device 1120 may include a keyboard, a keypad, or a display device.

The memory 1130 may include a semiconductor memory device according to the embodiments of the inventive concept. The memory 1130 may further include a non-volatile memory capable of electrically erasing and programming data and preserving stored data in spite of interruption of power supply, and other various types of memory.

The interface 1140 may transmit and receive data to and from a communication network.

Furthermore, the semiconductor memory device or memory system of the inventive concept may be mounted using various kinds of packages. The various kinds of the packages of the flash memory device or the memory system may include Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

By way of summation and review, in a capacitor using a dielectric layer having a high dielectric constant, when upper and lower electrodes are made of polysilicon, an oxide layer having a low dielectric constant is formed since oxygen in the dielectric layer may react with the polysilicon. Consequently, the capacitance of the capacitor may be reduced. In addition, since an energy band gap increases according to increase of the dielectric constant of the dielectric layer, an energy barrier between the dielectric layer and the polysilicon layer may reduce, accordingly increasing a current leakage of the capacitor. To this end, there has been developed a metal-insulator-metal (MIM) capacitor which uses a metal material for an electrode, the metal material having an excellent oxidation resistant property and a high work function compared to polysilicon. Since the metal electrode of the MIM capacitor has high work function and oxidation resistance property, generation of the low dielectric-constant oxide layer may be restrained during vapor deposition of the dielectric layer. Furthermore, the current leakage of the capacitor may be reduced by a heterojunction between the dielectric layer and the metal electrode.

However, according to ultra-high integration of the semiconductor memory devices to a 30 nm design rule or less, it becomes desirable to reduce the equivalent oxide thickness of the dielectric layer to obtain sufficient capacitance in the MIM capacitor. For this, the dielectric constant of the dielectric layer may be increased, since the equivalent oxide thickness is inversely proportional to the dielectric constant. A high-temperature heat treatment is desirable to form the dielectric layer having a high dielectric constant. The heat treatment may be performed at such a high temperature for oxidizing the metal electrode disposed under the dielectric layer. A reaction layer may be generated, according to this, between the dielectric layer and the lower metal electrode. The oxidation of the lower metal electrode and the reaction layer generated between the dielectric layer and the lower metal layer may deteriorate the dielectric layer characteristics and increase the current leakage of the capacitor.

According to the embodiments described above, since a lower electrode is formed after a dielectric layer is formed, the lower electrode may be prevented from being exposed by a high-temperature heat treatment performed during the formation of the dielectric layer. That is, the dielectric layer having a high dielectric constant can be formed by the heat treatment while oxidation of the lower electrode is prevented. Accordingly, capacitance of a capacitor may be increased. In addition, after formation of the lower electrode, a blocking insulating pattern having a low dielectric constant is formed on an upper surface of the lower electrode to be thicker than a dielectric layer pattern disposed on a sidewall of the lower electrode. Accordingly, a leakage current of the capacitor may be reduced. As a consequence, electrical characteristics of the MIM capacitor may be improved.

Accordingly, the present disclosure provides a method of manufacturing a semiconductor device provided with a capacitor having a metal-insulator-metal (MIM) structure improved in the electrical characteristic and also provides a semiconductor device provided with a capacitor having an MIM structure improved in the electrical characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a capacitor of a semiconductor device, comprising:
   forming a high-k dielectric pattern on a semiconductor substrate, the high-k dielectric pattern having a pillar shape including a hole therein;
   forming a lower electrode in the hole of the high-k dielectric pattern;
   forming a blocking insulating pattern on an upper surface of the lower electrode; and
   forming an upper electrode covering the high-k dielectric pattern and the blocking insulating pattern.

2. The method as claimed in claim 1, wherein the blocking insulating pattern is made of a material having a lower dielectric constant than the high-k dielectric pattern.

3. The method as claimed in claim 2, wherein the blocking insulating pattern is formed to be thicker than the high-k dielectric pattern.

4. The method as claimed in claim 2, wherein the forming of the blocking insulating pattern includes:
   forming a recess region partially exposing a sidewall of the high-k dielectric pattern by recessing the upper surface of the lower electrode; and
   forming the blocking insulating pattern in the recess region.

5. The method as claimed in claim 1, wherein the forming of the high-k dielectric pattern includes:
   forming an insulating layer and a sacrificial layer sequentially on the semiconductor substrate;
   forming an opening in the sacrificial layer to expose the insulating layer;
   forming a high-k dielectric layer conformally on a surface of the opening;
   performing a first heat treatment to the high-k dielectric layer in an oxygen atmosphere at a temperature of about 500° C. to 1000° C.; and
   forming the hole by patterning the heat-treated high-k dielectric layer and the insulating layer.

6. The method as claimed in claim 5, wherein the forming of the lower electrode includes:
   forming a first lower conductive layer conformally on the heat-treated high-k dielectric layer before the hole is formed;
   forming a first lower conductive pattern on the high-k dielectric pattern simultaneously with formation of the hole; and
   forming a second lower conductive pattern that fills the hole.

7. The method as claimed in claim 5, wherein the upper electrode directly contacts an upper surface of the insulating layer.

8. The method as claimed in claim 5, further including:
   removing the sacrificial layer before forming the upper electrode; and
   forming an upper dielectric layer having a same crystalline structure as the high-k dielectric pattern by using the high-k dielectric pattern as a seed.

9. The method as claimed in claim 5, wherein the sacrificial layer includes any one of a silicon oxide, a polysilicon, and a polymer-based material.

10. The method as claimed in claim 1, wherein the high-k dielectric pattern includes any one or a combination of $HfO_2$, $ZrO_2$, $AlO_3$, $La_2O_3$, $Ta_2O_3$, $TiO_2$, $SrTiO_3$(STO), $(Ba,Sr)TiO_3$ (BST), $BaTiO_2$, PZT, and PLZT.

11. The method as claimed in claim 1, wherein the blocking insulating pattern includes at least one of a silicon oxide, a silicon nitride, a silicon oxynitride, and a metal oxide.

12. A method of manufacturing a capacitor of a semiconductor device, the method comprising:
   forming an etch-stop layer and a sacrificial layer on a substrate, the substrate including a transistor and a contact plug electrically connected to a drain region of the transistor;
   forming a hole in the sacrificial layer to expose the etch stop layer in a region of the etch-stop layer corresponding to the contact plug;
   conformally forming a high k dielectric layer on the sacrificial layer, including on sidewalls of the hole, and the exposed etch-stop layer;
   performing a first heat treatment;
   forming a first lower conductive layer on the high k dielectric layer after the first heat treatment;
   performing a plasma treatment and a second heat treatment;
   etching the high-k dielectric layer and the first lower conductive layer to remove the high k dielectric layer and the first lower conductive layer from an upper surface of the sacrificial layer and from a bottom portion of the hole such that the contact plug is exposed, thereby forming a high k dielectric pattern and first lower conductive layer pattern on the sidewalls of the hole;
   forming a second lower conductive layer that fills the hole;
   removing upper portions of the first lower conductive layer pattern and second lower conductive layer to provide a recess region and to expose an upper portion of the high-k dielectric pattern;
   forming a blocking insulating pattern in the recess region, wherein the removing of the upper portions of the first lower conductive layer pattern and the second conductive layer to provide the recess region is carried out such that the blocking insulating pattern formed in the recess region has a greater thickness than a thickness of the high k dielectric pattern;
   removing the sacrificial layer to expose an outer surface of the high k dielectric pattern;
   conformally forming an upper electrode to cover the high k dielectric pattern and the blocking insulating pattern; and
   performing a third heat treatment.

* * * * *